(12) United States Patent
Pendse

(10) Patent No.: US 8,476,761 B2
(45) Date of Patent: Jul. 2, 2013

(54) SEMICONDUCTOR DEVICE AND METHOD OF CONFINING CONDUCTIVE BUMP MATERIAL DURING REFLOW WITH SOLDER MASK PATCH

(75) Inventor: Rajendra D. Pendse, Fremont, CA (US)

(73) Assignee: STATS ChipPAC, Ltd., Singapore (SG)

( * ) Notice: Subject to any disclaimer, the term of this patent is extended or adjusted under 35 U.S.C. 154(b) by 0 days.

(21) Appl. No.: 13/476,899

(22) Filed: May 21, 2012

(65) Prior Publication Data
US 2012/0228766 A1    Sep. 13, 2012

Related U.S. Application Data

(62) Division of application No. 12/633,531, filed on Dec. 8, 2009, now Pat. No. 8,198,186.

(60) Provisional application No. 61/141,782, filed on Dec. 31, 2008.

(51) Int. Cl.
H01L 23/48    (2006.01)

(52) U.S. Cl.
USPC ............. 257/737; 257/738; 257/E23.021

(58) Field of Classification Search
USPC ........... 257/737, E23.021, E21.509, E23.068, 257/E21.513, E21.506, 738, 778
See application file for complete search history.

(56) References Cited

U.S. PATENT DOCUMENTS

| | | | |
|---|---|---|---|
| 5,378,859 A | 1/1995 | Shirasaki et al. | |
| 5,386,624 A | 2/1995 | George et al. | |
| 5,434,410 A | 7/1995 | Kulwicki | |
| 5,508,561 A | 4/1996 | Tago et al. | |
| 5,519,580 A | 5/1996 | Natarajan et al. | |
| 5,650,595 A | 7/1997 | Bentlage et al. | |

(Continued)

FOREIGN PATENT DOCUMENTS

| | | |
|---|---|---|
| JP | 04-355933 | 9/1992 |
| JP | 10-256307 | 9/1998 |
| JP | 2000-031204 | 1/2000 |
| JP | 2004-221205 | 5/2004 |

OTHER PUBLICATIONS

Yamada, Hiroshi et al., "Advanced copper column based solder bump for flip-chip interconnection", International Symposium on Microelectronics, 1997, pp. 417-422, The British Library—"The world's knowledge".

(Continued)

Primary Examiner — Roy Potter
(74) Attorney, Agent, or Firm — Robert D. Atkins; Patent Law Group: Atkins & Associates, P.C.

(57) ABSTRACT

A semiconductor device has a semiconductor die with die bump pads and substrate with trace lines having integrated bump pads. A solder mask patch is formed interstitially between the die bump pads or integrated bump pads. The solder mask patch contains non-wettable material. Conductive bump material is deposited over the integrated bump pads or die bump pads. The semiconductor die is mounted over the substrate so that the conductive bump material is disposed between the die bump pads and integrated bump pads. The bump material is reflowed without a solder mask around the integrated bump pads to form an interconnect between the semiconductor die and substrate. The solder mask patch confines the conductive bump material within a footprint of the die bump pads or integrated bump pads during reflow. The interconnect can have a non-fusible base and fusible cap.

25 Claims, 7 Drawing Sheets

U.S. PATENT DOCUMENTS

| | | | |
|---|---|---|---|
| 5,710,071 | A | 1/1998 | Beddingfield et al. |
| 5,844,782 | A | 12/1998 | Fukasawa |
| 5,869,886 | A | 2/1999 | Tokuno |
| 5,872,399 | A | 2/1999 | Lee et al. |
| 5,889,326 | A | 3/1999 | Tanaka |
| 5,915,169 | A | 6/1999 | Heo |
| 5,985,456 | A | 11/1999 | Zhou et al. |
| 6,201,305 | B1 | 3/2001 | Darveaux et al. |
| 6,218,630 | B1 | 4/2001 | Takigami |
| 6,228,466 | B1 | 5/2001 | Tsukada et al. |
| 6,259,163 | B1 | 7/2001 | Ohuchi et al. |
| 6,281,450 | B1 | 8/2001 | Urasaki et al. |
| 6,297,560 | B1 | 10/2001 | Capote et al. |
| 6,324,754 | B1 | 12/2001 | DiStefano et al. |
| 6,329,605 | B1 | 12/2001 | Beroz et al. |
| 6,335,568 | B1 | 1/2002 | Yuzawa et al. |
| 6,335,571 | B1 | 1/2002 | Capote et al. |
| 6,396,707 | B1 | 5/2002 | Huang et al. |
| 6,441,316 | B1 | 8/2002 | Kusui |
| 6,448,665 | B1 | 9/2002 | Nakazawa et al. |
| 6,573,610 | B1 | 6/2003 | Tsai |
| 6,600,234 | B2 | 7/2003 | Kuwabara et al. |
| 6,678,948 | B1 | 1/2004 | Benzler et al. |
| 6,710,458 | B2 | 3/2004 | Seko |
| 6,734,557 | B2 | 5/2004 | Taniguchi et al. |
| 6,774,497 | B1 | 8/2004 | Qi et al. |
| 6,780,673 | B2 | 8/2004 | Venkateswaran |
| 6,787,918 | B1 | 9/2004 | Tsai et al. |
| 6,809,262 | B1 | 10/2004 | Hsu |
| 6,818,545 | B2 | 11/2004 | Lee et al. |
| 6,849,944 | B2 | 2/2005 | Murtuza et al. |
| 6,870,276 | B1 | 3/2005 | Moxham et al. |
| 6,888,255 | B2 | 5/2005 | Murtuza et al. |
| 6,913,948 | B2 | 7/2005 | Caletka et al. |
| 7,005,585 | B2 | 2/2006 | Ishizaki |
| 7,005,750 | B2 | 2/2006 | Liu et al. |
| 7,049,705 | B2 | 5/2006 | Huang |
| 7,057,284 | B2 | 6/2006 | Chauhan et al. |
| 7,064,435 | B2 | 6/2006 | Chung et al. |
| 7,098,407 | B2 | 8/2006 | Kim et al. |
| 7,102,239 | B2 | 9/2006 | Pu et al. |
| 7,173,828 | B2 | 2/2007 | Lin et al. |
| 7,224,073 | B2 | 5/2007 | Kim |
| 7,242,099 | B2 | 7/2007 | Lin et al. |
| 7,271,484 | B2 | 9/2007 | Reiss et al. |
| 7,294,929 | B2 | 11/2007 | Miyazaki |
| 7,317,245 | B1 | 1/2008 | Lee et al. |
| 7,405,484 | B2 | 7/2008 | Usui et al. |
| 7,436,063 | B2 | 10/2008 | Miyata et al. |
| 7,521,284 | B2 | 4/2009 | Miranda et al. |
| 7,642,660 | B2 | 1/2010 | Tay et al. |
| 7,670,939 | B2 | 3/2010 | Topacio et al. |
| 7,671,454 | B2 | 3/2010 | Seko |
| 7,732,913 | B2 | 6/2010 | Hsieh et al. |
| 7,750,457 | B2 | 7/2010 | Seko |
| 7,790,509 | B2 | 9/2010 | Gerber |
| 7,791,211 | B2 | 9/2010 | Chen et al. |
| 7,847,399 | B2 | 12/2010 | Masumoto |
| 7,847,417 | B2 | 12/2010 | Araki et al. |
| 7,851,928 | B2 | 12/2010 | Gallegos et al. |
| 7,898,083 | B2 | 3/2011 | Castro |
| 7,902,660 | B1 | 3/2011 | Lee et al. |
| 7,902,678 | B2 | 3/2011 | Ohuchi et al. |
| 7,902,679 | B2 | 3/2011 | Lin et al. |
| 7,932,170 | B1 | 4/2011 | Huemoeller et al. |
| 7,947,602 | B2 | 5/2011 | Ito et al. |
| 8,278,144 | B2 * | 10/2012 | Pendse .......................... 438/108 |
| 2004/0056341 | A1 | 3/2004 | Endo et al. |
| 2004/0232562 | A1 | 11/2004 | Hortaleza et al. |
| 2005/0103516 | A1 | 5/2005 | Kaneyuki |
| 2005/0248037 | A1 | 11/2005 | Hung et al. |
| 2006/0131758 | A1 | 6/2006 | Dao |
| 2007/0200234 | A1 | 8/2007 | Gerber et al. |
| 2008/0093749 | A1 | 4/2008 | Gerber et al. |
| 2008/0179740 | A1 | 7/2008 | Liao |
| 2008/0277802 | A1 | 11/2008 | Tsai et al. |
| 2009/0108445 | A1 | 4/2009 | Liang |
| 2009/0114436 | A1 | 5/2009 | Chen et al. |
| 2009/0152716 | A1 | 6/2009 | Sohara |
| 2009/0191329 | A1 | 7/2009 | Wang |
| 2009/0288866 | A1 | 11/2009 | Tsai et al. |
| 2009/0308647 | A1 | 12/2009 | Liao |
| 2010/0139965 | A1 | 6/2010 | Wang et al. |
| 2011/0049703 | A1 | 3/2011 | Hsu et al. |

OTHER PUBLICATIONS

Yamada, Hiroshi et al., "A fine pitch and high aspect ratio bump array for flip-chip interconnection", Int'l Electronics Manufacturing Technology Symposium, 1992, pp. 288-292, IEEE/CHMT.

Son, Ho Young et al., "Studies on the Thermal Cycling Reliability of Fine Pitch Cu/SnAg Double-Bump Flip Chip Assemblies on Organic Substrates: Experimental Results and Numerical Analysis", Electronic Components and Technology Conference, 2008, pp. 2035-2043.

Lu, H. et al., "Predicting Optimal Process Conditions for Flip-Chip Assembly Using Copper Column Bumped Dies", Electronics Packaging Technology Conference, 2002, pp. 338-343.

Kawahara, Toshimi, "SuperCSP", IEEE Transactions on Advanced Packaging, May 2000, pp. 215-219, vol. 23, No. 2.

* cited by examiner

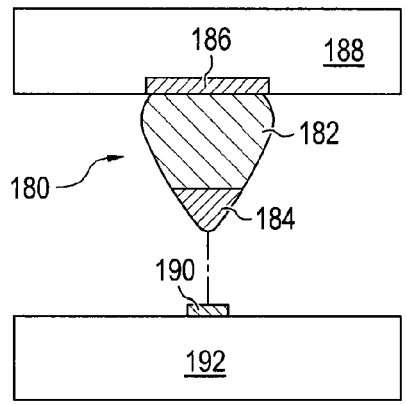
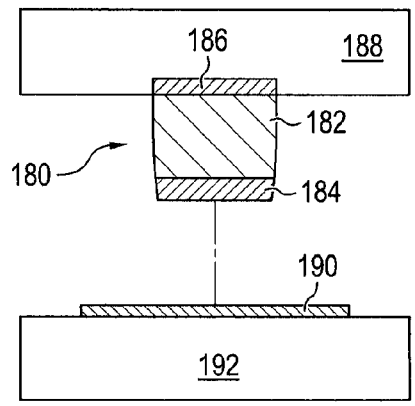
FIG. 10a    FIG. 10b
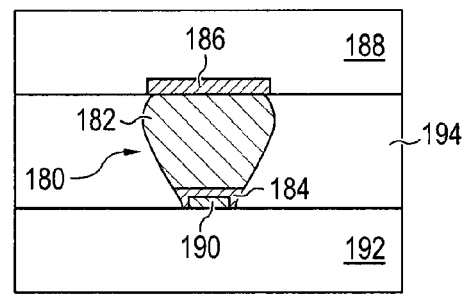
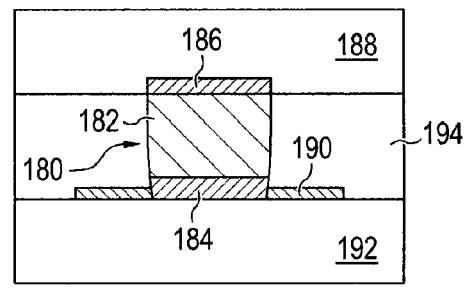
FIG. 10c    FIG. 10d

US 8,476,761 B2

SEMICONDUCTOR DEVICE AND METHOD OF CONFINING CONDUCTIVE BUMP MATERIAL DURING REFLOW WITH SOLDER MASK PATCH

CLAIM TO DOMESTIC PRIORITY

The present application is a division of U.S. application Ser. No. 12/633,531, filed Dec. 8, 2009, now U.S. Pat. No. 8,198,186, which claims the benefit of Provisional Application No. 61/141,782, filed Dec. 31, 2008, which applications are incorporated herein by reference.

FIELD OF THE INVENTION

The present invention relates in general to semiconductor devices and, more particularly, to a semiconductor device and method of confining conductive bump material during reflow with solder mask patch.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

FIGS. 1 and 2 illustrate a cross-sectional view and top view of a portion of flipchip type semiconductor die 10 and interconnects or bumps 12 metallurgically and electrically connected between bump pads 18 as formed on semiconductor die 10 and trace lines 20 and 22 as formed on substrate 30. Trace line 22 is routed between traces lines 20 and bumps 12 on substrate 30. Trace lines 20 and 22 are electrical signal conductors with optional bump pads for mating to bumps 12-14. Solder mask 26 overlays trace lines 20 and 22. Solder mask or registration openings (SRO) 28 are formed over substrate 30 to expose trace lines 20 and 22. SRO 28 confines the conductive bump material on the bump pads of trace lines 20 and 22 during reflow and prevents the molten bump material from leaching onto the trace lines, which can cause electrical shorts to adjacent structures. SRO 28 is made larger than the trace line or bump pad. SRO 28 is typically circular in shape and made as small as possible to reduce the pitch of trace lines 20 and 22 and increase routing density.

In typical design rules, the minimum escape pitch of trace line 30 is defined by $P=(1.1D+W)/2+L$, where D is bump base diameter, W is trace line width, and L is the ligament separation between SRO and adjacent structures. Using a solder registration design rule of ±30 micrometers (μm), D of 100 μm, W of 20 μm, and L of 30 μm, the minimum escape pitch of trace lines 30-34 is $(1.1*100+20)/2+30=95$ μm. SRO 28 around the bump pads limits the escape pitch and routing density of the semiconductor die.

SUMMARY OF THE INVENTION

A need exists to minimize escape pitch of trace lines for higher routing density. Accordingly, in one embodiment, the present invention is a semiconductor device comprising a semiconductor die including an array of die bump pads. A substrate comprises a plurality of trace lines including integrated bump pads formed as an array over the substrate. A plurality of mask patches is formed between the array of die bump pads. A bump is disposed between one of the die bump pads and integrated bump pads without a mask.

In another embodiment, the present invention is a semiconductor device comprising a semiconductor die including a plurality of die bump pads. A substrate comprises a plurality of trace lines including integrated bump pads. A plurality of mask patches is formed between the integrated bump pads. A bump is disposed between one of the plurality of die bump pads and integrated bump pads.

In another embodiment, the present invention is a semiconductor device comprising a substrate comprising a plurality of trace lines including integrated bump pads. A plurality of mask patches is formed between the integrated bump pads. An interconnect structure is disposed over one of the integrated bump pads.

In another embodiment, the present invention is a semiconductor device comprising a substrate including a plurality of trace lines. A mask patch is formed between the plurality of trace lines. An interconnect structure is disposed over one of the trace lines.

BRIEF DESCRIPTION OF THE DRAWINGS

FIGS. 10a-10d illustrate a tapered composite interconnect with non-fusible base and fusible cap.

DETAILED DESCRIPTION OF THE DRAWINGS

Figure 1:
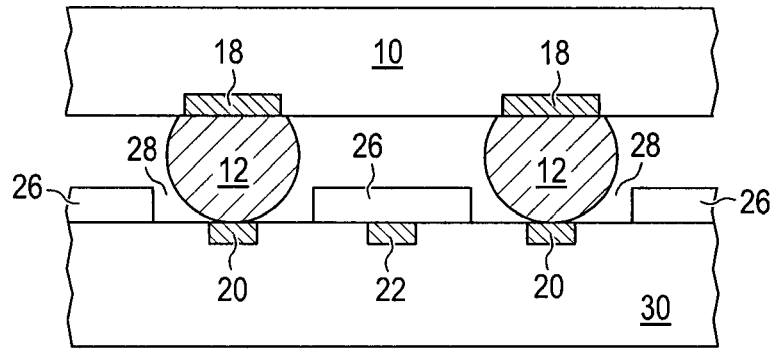
FIG. 1 illustrates a cross-sectional view of conventional interconnects formed between a semiconductor die and trace lines on a substrate.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 3:
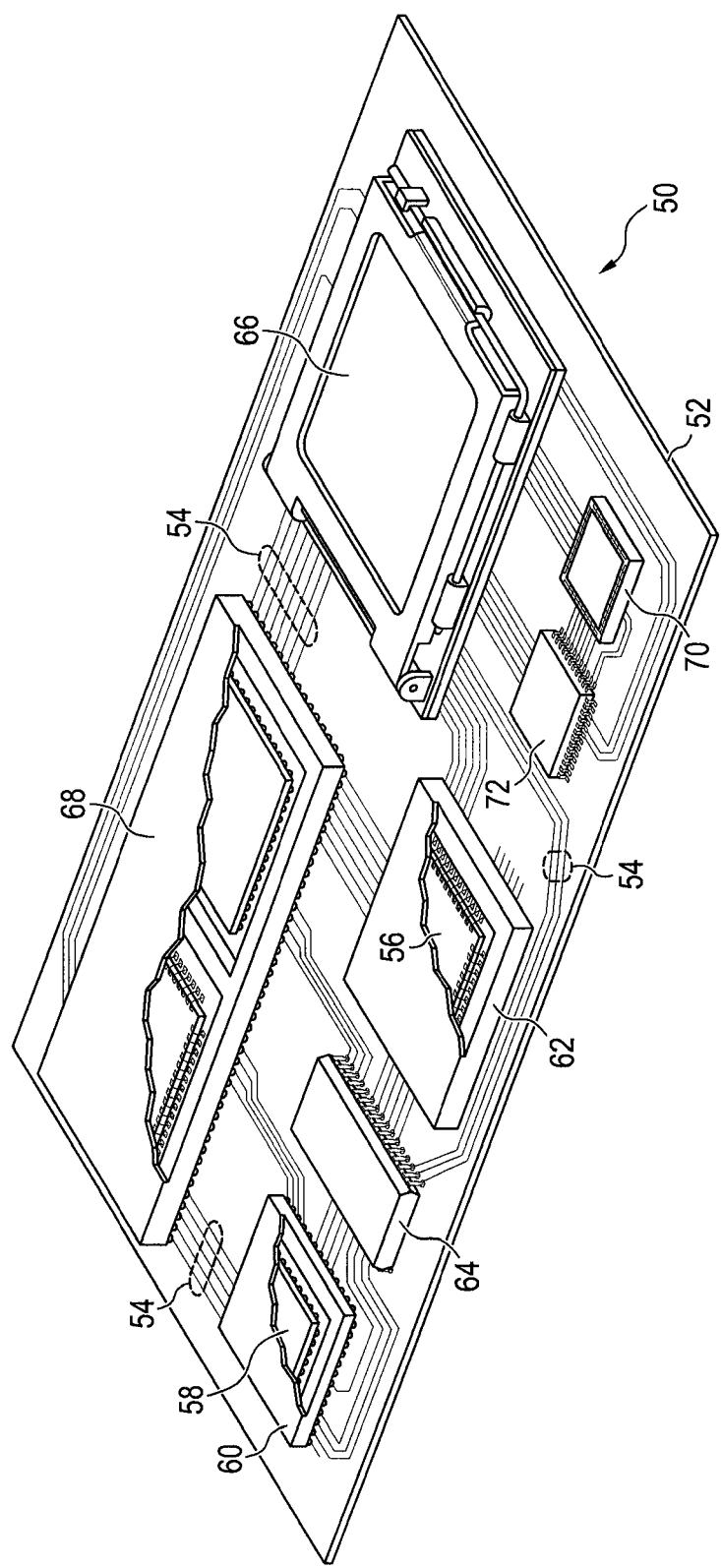
FIG. 3 illustrates a PCB with different types of packages mounted to its surface.

FIG. 3 illustrates electronic device 50 having a chip carrier substrate or printed circuit board (PCB) 52 with a plurality of semiconductor packages mounted on its surface. Electronic device 50 may have one type of semiconductor package, or multiple types of semiconductor packages, depending on the application. The different types of semiconductor packages are shown in FIG. 3 for purposes of illustration.

Electronic device 50 may be a stand-alone system that uses the semiconductor packages to perform one or more electrical functions. Alternatively, electronic device 50 may be a subcomponent of a larger system. For example, electronic device 50 may be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components.

In FIG. 3, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 4A:
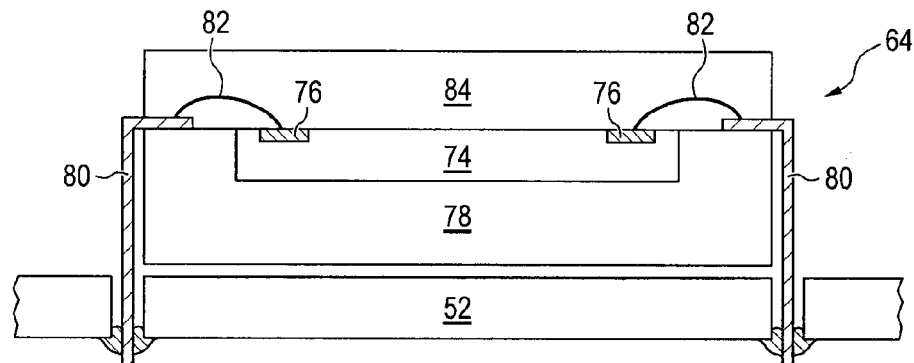
FIGS. 4a-4d illustrate further detail of the representative semiconductor packages mounted to the PCB.

FIGS. 4a-4d show exemplary semiconductor packages. FIG. 4a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit may include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy. The package body includes an insulative packaging material such as polymer or ceramic. Conductor leads 80 and wire bonds 82 provide electrical interconnect between semiconductor die 74 and PCB 52. Encapsulant 84 is deposited over the package for environmental protection by preventing moisture and particles from entering the package and contaminating die 74 or wire bonds 82.

Figure 4B:
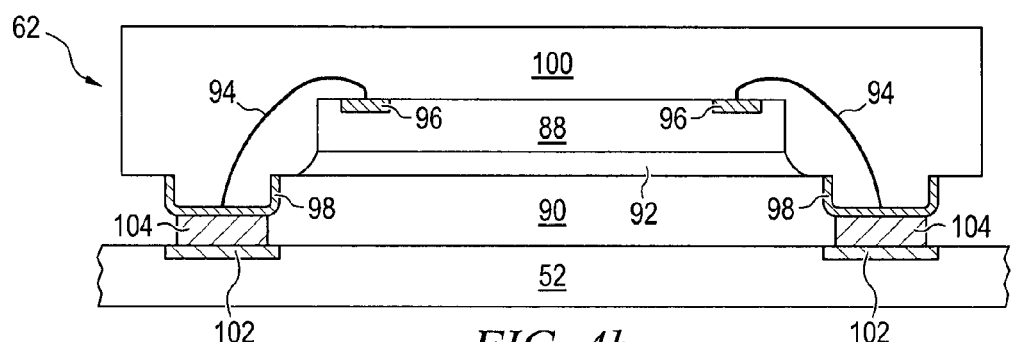

FIG. 4b illustrates further detail of BCC 62 mounted on PCB 52. Semiconductor die 88 is mounted over carrier 90 using an underfill or epoxy-resin adhesive material 92. Wire bonds 94 provide first level packing interconnect between contact pads 96 and 98. Molding compound or encapsulant 100 is deposited over semiconductor die 88 and wire bonds 94 to provide physical support and electrical isolation for the device. Contact pads 102 are formed over a surface of PCB 52 using a suitable metal deposition such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

Figure 4C:
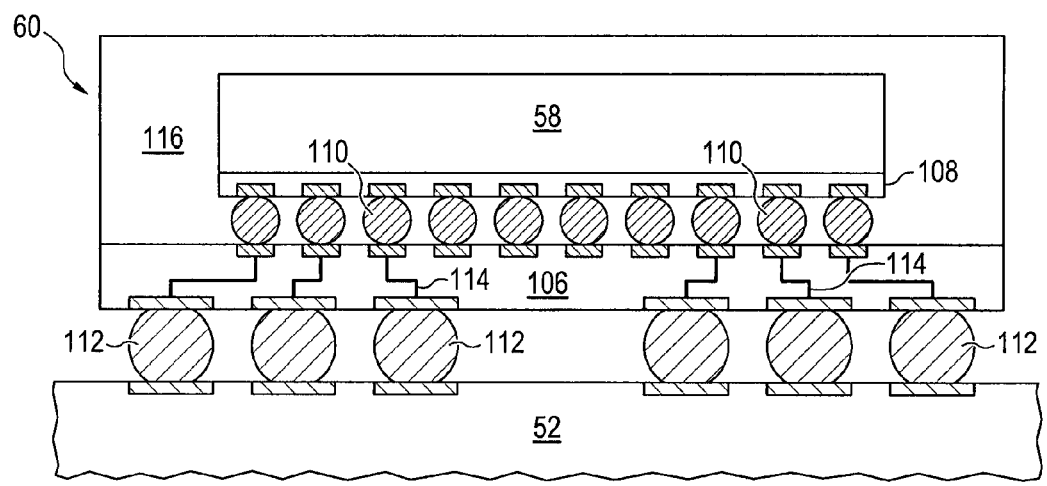

In FIG. 4c, semiconductor die 58 is mounted face down to intermediate carrier 106 with a flip chip style first level packaging. Active region 108 of semiconductor die 58 contains analog or digital circuits implemented as active devices, passive devices, conductive layers, and dielectric layers formed according to the electrical design of the die. For example, the circuit may include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flip chip style first level packaging without intermediate carrier 106.

Figure 4D:
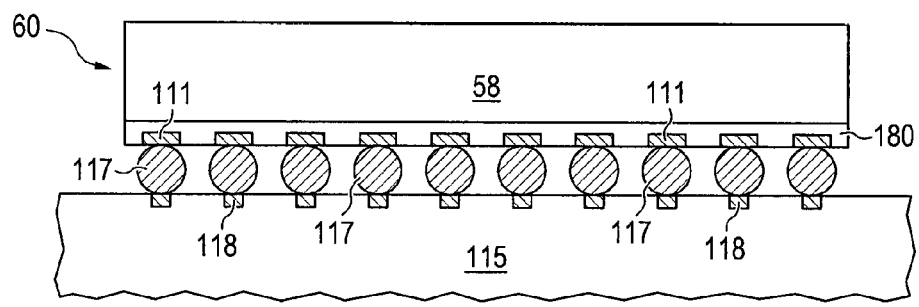

In another embodiment, active area 108 of semiconductor die 58 is directly mounted facedown to PCB 115, i.e., without an intermediate carrier, as shown in FIG. 4d. Bump pads 111 are formed on active area 108 using an evaporation, electrolytic plating, electroless plating, screen printing, or other suitable metal deposition process. Bump pads 111 connect to the active and passive circuits by conduction tracks in active area 108. Bump pads 111 can be Al, Sn, Ni, Au, Ag, or Cu. An electrically conductive bump material is deposited over bump pads 111 or conduction tracks 118 in PCB 115 using an evaporation, electrolytic plating, electroless plating, ball drop, or screen printing process. The bump material can be Al, Sn, Ni, Au, Ag, lead (Pb), Bi, Cu, solder, and combinations thereof, with an optional flux material. For example, the bump material can be eutectic Sn/Pb, high-lead solder, or lead-free solder. The bump material is bonded between die bump pads 111 and conduction tracks 118 on PCB 115 using a suitable attachment or bonding process. In one embodiment, the bump material is reflowed by heating the material above its melting point to form spherical balls or bumps 117. The flip chip semiconductor device provides a short electrical conduction path from the active devices on semiconductor die 58 to conduction tracks 118 on PCB 115 in order to reduce signal propagation, lower capacitance, and achieve overall better circuit performance.

Figure 5:
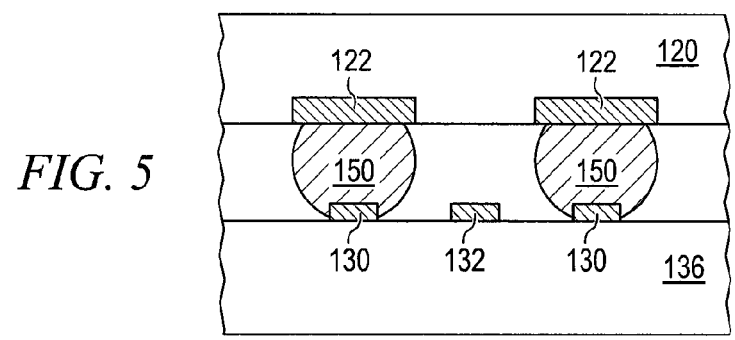
FIG. 5 illustrates interconnects formed between a semiconductor die and trace lines on a substrate.
Figure 6A:
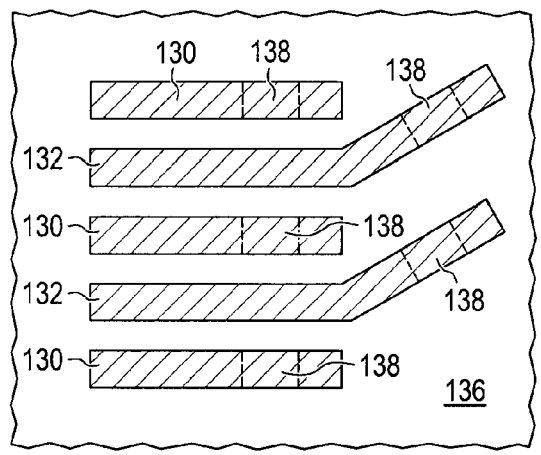
FIGS. 6a-6c illustrate integrated bump pads along the trace lines.
Figure 6B:
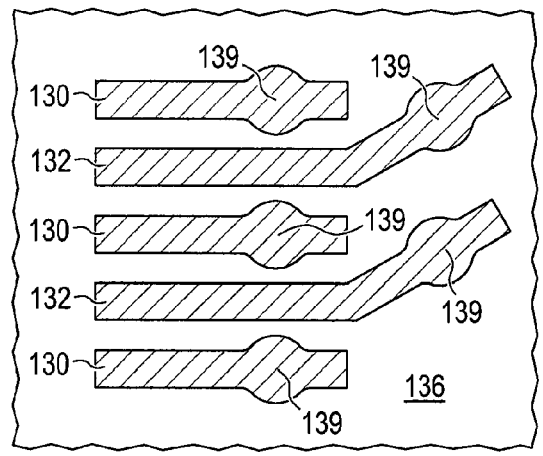
Figure 6C:
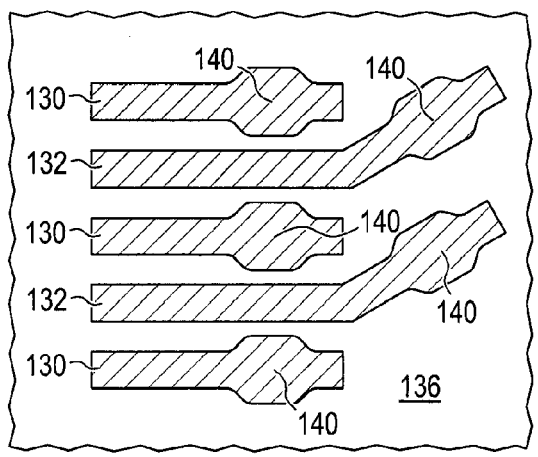

FIG. 5 illustrates a cross-sectional view of a portion of flipchip type semiconductor die 120 with bump pads 122. Trace lines 130 and 132 are formed on substrate 136. Trace lines 130 and 132 are straight electrical conductors with integrated bump pads 138, as shown in FIG. 6a. The integrated bump pads 138 are co-linear with trace lines 130 and 132. Alternatively, trace lines 130 and 132 can have round integrated bump pads 139, as shown in FIG. 6b, or rectangular integrated bump pads 140, as shown in FIG. 6c. The integrated bump pads are typically arranged in an array for maximum interconnect density and capacity.

Figure 2:
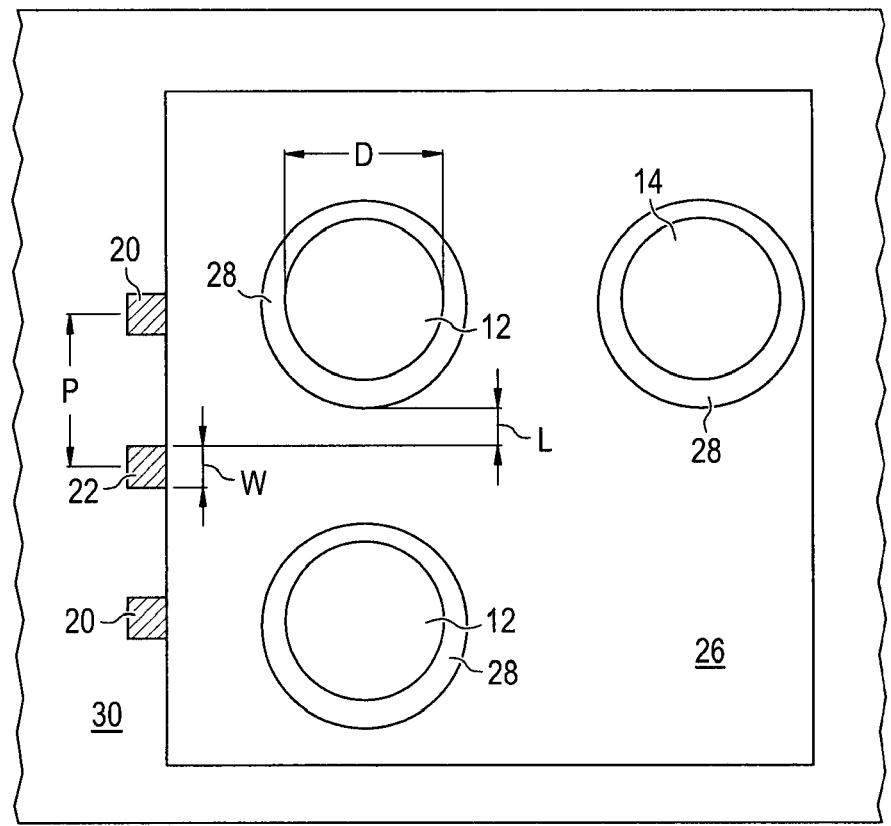
FIG. 2 illustrates a top view of conventional interconnects formed over the trace lines through solder mask openings.
Figure 7:
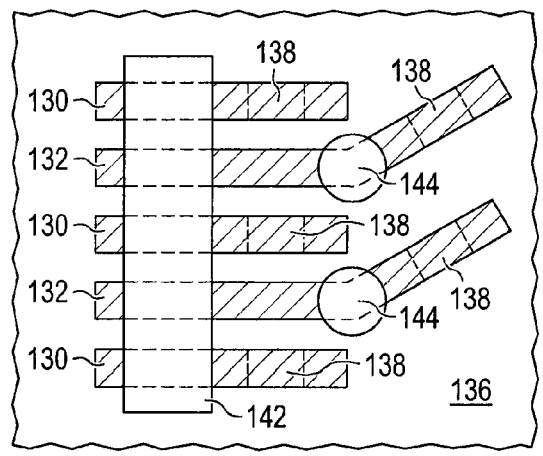
FIG. 7 illustrates a solder mask patch formed interstitially within the array of integrated bump pads on the substrate.
Figure 8:
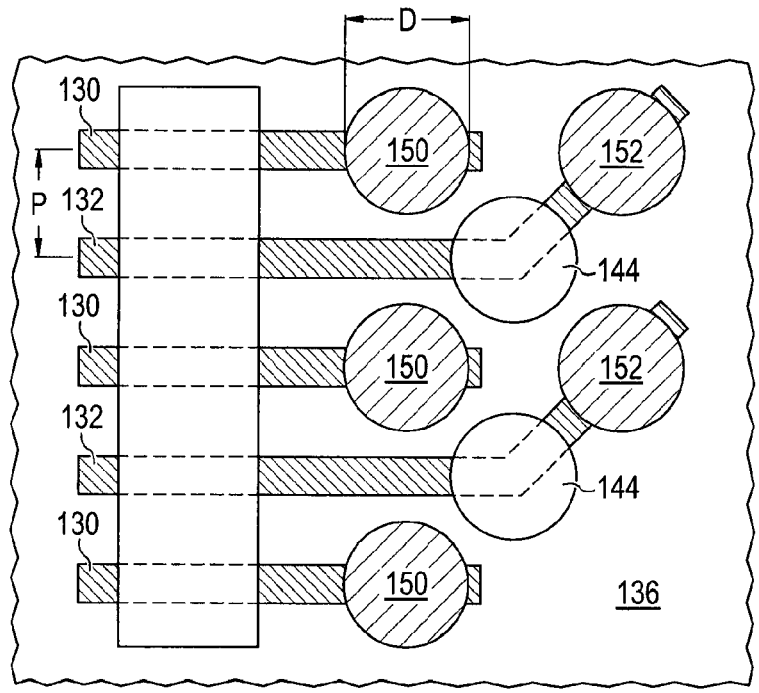
FIG. 8 illustrates bumps formed on the integrated bump pads with bump material confined by the solder mask patch during reflow.

In FIG. 7, solder mask 142 is deposited over a portion of trace lines 130 and 132. However, solder mask 142 is not formed over integrated bump pads 138. Consequently, there is no SRO for each bump pad on the substrate, as found in prior art FIG. 2. A non-wettable solder mask patch 144 is formed on substrate 136 interstitially within the array of integrated bump pads 138, i.e., between adjacent bump pads. The solder mask patch can also be formed on semiconductor die 10 interstitially within the array of die bump pads 122. More generally, the solder mask patch is formed in close proximity to the integrated bump pads in any arrangement to prevent run-out to less wettable areas. FIG. 8 shows bumps 150 and 152 formed over integrated bump pads 138 and confined by solder mask patch 144.

An electrically conductive bump material is deposited over die bump pads 122 or integrated bump pads 138 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to integrated bump pads 138 using a suitable attachment or bonding process. In one embodiment, the bump material is reflowed by heating the material above its melting point to form spherical balls or bumps 150, 152, and 152. In some applications, bumps 150 and 152 are reflowed a second time to improve electrical contact to die bump pads 122 and integrated bump pads 138. The bumps can also be compression bonded to die bump pads 122 and integrated bump pads 138. Bumps 150 and 152 represent one type of interconnect structure that can be formed over integrated bump pads 138. The interconnect structure can also use stud bump, micro bump, or other electrical interconnect.

In high routing density applications, it is desirable to minimize escape pitch. In order to reduce the pitch between trace lines 130 and 132, the bump material is reflowed without a solder mask around integrated bump pads 138. The escape pitch between trace lines 130 and 132 can be reduced by eliminating the solder mask and associated SROs around the integrated bump pads for solder reflow containment, i.e., by reflowing the bump material without a solder mask. Solder mask 142 may be formed over a portion of traces lines 130 and 132 and substrate 136 away from integrated bump pads 138, as shown in FIG. 7. However, solder mask 142 is not formed over integrated bump pads 138. That is, the portion of trace lines 130 and 132 designed to mate with the bump material is devoid of an SRO formed in solder mask 142.

In addition, solder mask patch 144 is formed on substrate 136 interstitially within the array of integrated bump pads 138. Solder mask patch 144 is non-wettable material. Solder mask patch 144 can be the same material as solder mask 142 and applied during the same processing step, or a different material during a different processing step. Solder mask patch 144 can be formed by selective oxidation, plating, or other treatment of the portion of the trace or pad within the array of integrated bump pads 138. Solder mask patch 144 confines solder flow to integrated bump pads 138 and prevents leaching of conductive bump material to adjacent structures.

When the bump material is reflowed with solder mask patch 144 interstitially disposed within the array of integrated bump pads 138, the wetting and surface tension causes the bump material to be confined and retained within the space between die bump pads 122 and integrated bump pads 138 and portion of substrate 136 immediately adjacent to trace lines 130 and 132 and substantially within the footprint of the integrated bump pads 138.

To achieve the desired confinement property, the bump material can be immersed in a flux solution prior to placement on die bump pad 122 or integrated bump pads 138 to selectively render the region contacted by the bump material more wettable than the surrounding area of trace lines 130 and 132. The molten bump material remains confined substantially within the area defined by the bump pads due to the wettable properties of the flux solution. The bump material does not run-out to the less wettable areas. A thin oxide layer or other insulating layer can be formed over areas where bump material is not intended to make the area less wettable. Hence, solder mask 142 is not needed around die bump pads 122 or integrated bump pads 138.

Since no SRO is formed around die bump pads 122 or integrated bump pads 138, trace lines 130 and 132 can be formed with a finer pitch, i.e., trace lines 130 and 132 can be disposed closer to adjacent structures without making contact and forming electrical shorts. Assuming the same solder registration design rule, the pitch between trace lines 130 and 132 is given as $P=(1.1D+W)/2$, where D is the base diameter of bump 150-152 and W is the width of the trace lines 130 and 132. In one embodiment, given a bump diameter of 100 μm and trace line width of 20 μm, the minimum escape pitch of trace lines 130 and 132 is 65 μm. The bump formation eliminates the need to account for the ligament spacing of solder mask material between adjacent openings and minimum resolvable SRO, as found in the prior art.

Figure 9A:
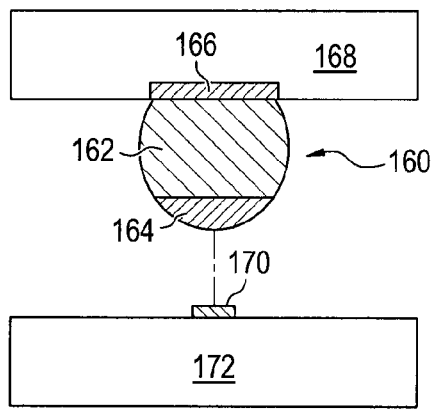
FIGS. 9a-9b illustrate a composite interconnect with non-fusible base and fusible cap.
Figure 9B:
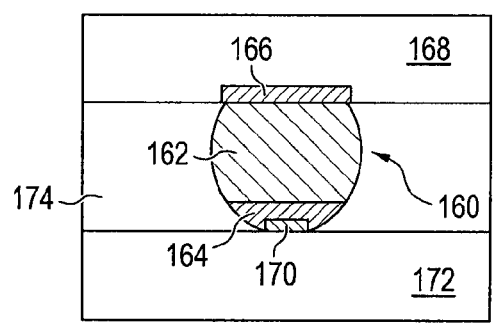

In another embodiment, a composite interconnect is formed between die bump pads and integrated bump pads to achieve the desired confinement of the bump material. In FIGS. 9a-9b, composite bump 160 has a non-fusible portion 162 and fusible portion 164. The non-fusible portion 162 makes up a larger part of composite bump 160 than the fusible portion 164. The non-fusible portion 162 is fixed to contact pad or interconnect site 166 of semiconductor die 168. The fusible portion 164 is positioned over lead or trace 170 on substrate 172 in FIG. 9a and brought into physical contact with lead 170 for reflow. The fusible portion 164 collapses around lead 170 upon reflow with heat or application of pressure, as shown in FIG. 9b. The non-fusible portion 162 does not melt or deform during reflow and retains its form and shape. The non-fusible portion 162 can be dimensioned to provide a standoff distance between semiconductor die 168 and substrate 172. A finish such as Cu organic solderability preservative (OSP) can be applied to substrate 172. A mold underfill material 174 is deposited between semiconductor die 168 and substrate 172 to fill the gap between the die and substrate.

The non-fusible portion 162 and fusible portion 164 of composite bump 160 are made of different bump material. The non-fusible portion 162 can be Au, Cu, Ni, high-lead solder, or lead-tin alloy. The fusible portion 164 can be Sn, lead-free alloy, Sn—Ag alloy, Sn—Ag—Cu alloy, Sn—Ag-indium (In) alloy, eutectic solder, or other tin alloys with Ag, Cu, or Pb.

The height or volume of fusible bump material in relation to the non-fusible base material is selected to ensure confinement by virtue of surface tension forces. During reflow, the fusible base material is confined around the non-fusible base material due to the solder mask patch. The fusible bump material around the non-fusible base also maintains die placement during reflow. In general the height of the composite interconnect is the same or less than the diameter of the bump. In some cases, the height of the composite interconnect is greater than the diameter of the interconnect. In one embodiment, given a bump base diameter of 100 µm, the non-fusible base is about 45 µm in height and the fusible cap is about 35 µm in height. The molten bump material remains confined substantially within the area defined by the bump pads due to the solder mask patch and because the volume of bump material deposited to form the composite bump, including non-fusible base and fusible cap, is selected so that the resulting surface tension is sufficient to retain the bump material substantially within the footprint of the bump pads and prevent run-out to unintended adjacent or nearby areas. Hence, the solder mask patch formed interstitially with the array of bump pads reduces trace line pitch and increases routing density.

During the reflow process, a large number (e.g., thousands) of composite bumps 160 on semiconductor die 168 are attached to interconnect sites on trace 170 of substrate 172. Some of the bumps 160 may fail to properly connect to substrate 172, particularly if die 168 is warped. Recall that composite bump 160 is larger than trace 170. With a proper force applied, the fusible portion 164 deforms or extrudes around trace 170 and mechanically locks composite bump 160 to substrate 172. The mechanical interlock is formed by nature of the fusible portion 164 being softer than trace 170. The mechanical interlock between composite bump 160 and substrate 172 holds the bump to the substrate during reflow, i.e., the bump and substrate do not lose contact. Accordingly, composite bump 160 mating to substrate 172 reduces the bump connect failures.

In another embodiment, the composite interconnect formed between die bump pads and integrated bump pads is tapered. Composite bump 180 has a non-fusible portion 182 and fusible portion 184, as shown in FIGS. 10a-10d. The non-fusible portion 182 makes up a larger part of composite bump 180 than the fusible portion 184. The non-fusible portion 182 is fixed to contact pad or interconnect site 186 of semiconductor die 188. The fusible portion 184 is positioned over lead or trace 190 on substrate 192 and brought into physical contact with lead 190 for reflow. Composite bump 180 is tapered along trace 190, i.e., the composite bump has a wedge shape, longer along a length of trace 190 and narrower across trace 190. The tapered aspect of composite bump 180 occurs along the length of trace 190. The view in FIG. 10a shows the narrowing taper co-linear with trace 190. The view in FIG. 10b, normal to FIG. 10a, shows the longer aspect of the wedge-shaped composite bump 180. The fusible portion 184 collapses around lead 190 upon reflow with heat or application of pressure as shown in FIGS. 10c and 10d. The non-fusible portion 182 does not melt or deform during reflow and retains its form and shape. The non-fusible portion 182 can be dimensioned to provide a standoff distance between semiconductor die 188 and substrate 192. A finish such as Cu OSP can be applied to substrate 192. A mold underfill material 194 is deposited between semiconductor die 188 and substrate 192 to fill the gap between the die and substrate.

The non-fusible portion 182 and fusible portion 184 of composite bump 180 are made of different bump material. The non-fusible portion 182 can be Au, Cu, Ni, high-lead solder, or lead-tin alloy. The fusible portion 184 can be Sn, lead-free alloy, Sn—Ag alloy, Sn—Ag—Cu alloy, Sn—Ag-indium (In) alloy, eutectic solder, or other tin alloys with Ag, Cu, or Pb.

During a reflow process, a large number (e.g., thousands) of composite bumps 180 on semiconductor die 188 are attached to interconnect sites on trace 190 of substrate 192. Some of the bumps 180 may fail to properly connect to substrate 192, particularly if die 188 is warped. Recall that composite bump 180 is larger than trace 190. With a proper force applied, the fusible portion 184 deforms or extrudes around trace 190 and mechanically locks composite bump 180 to substrate 192. The mechanical interlock is formed by nature of the fusible portion 184 being softer than trace 190. The mechanical interlock between composite bump 180 and substrate 192 holds the bump to the substrate during reflow, i.e., the bump and substrate do not lose contact. Accordingly, composite bump 180 mating to substrate 192 reduces the bump connect failures.

Any stress induced by the interconnect between the die and substrate can result in damage or failure of the die. The die contains low dielectric constant (k) materials, which are susceptible to damage from thermally induced stress. The tapered composite bump 180 reduces interconnect stress on semiconductor die 188, which results in less damage to the low k materials and a lower failure rate of the die.

While one or more embodiments of the present invention have been illustrated in detail, the skilled artisan will appreciate that modifications and adaptations to those embodiments may be made without departing from the scope of the present invention as set forth in the following claims.

What is claimed:

1. A semiconductor device, comprising:
a semiconductor die including an array of die bump pads;
a substrate including a plurality of trace lines comprising integrated bump pads formed as an array over the substrate;
a plurality of isolated mask patches formed between the array of die bump pads; and
a bump retained between one of the die bump pads and integrated bump pads by a surface tension.

2. The semiconductor device of claim 1, wherein the plurality of isolated mask patches includes non-wettable material.

3. The semiconductor device of claim 1, wherein the bump includes a non-fusible base and fusible cap.

4. The semiconductor device of claim 1, wherein an escape pitch of the plurality of trace lines is given by $(1.1D+W)/2$, wherein D is a diameter of the bump and W is a width of the plurality of trace lines.

5. The semiconductor device of claim 1, wherein the plurality of isolated mask patches confines the bump around the one of the integrated bump pads.

6. The semiconductor device of claim 1, wherein the plurality of isolated mask patches is formed interstitially within the array of die bump pads or the array of integrated bump pads.

7. A semiconductor device, comprising:
a semiconductor die including a plurality of die bump pads;
a substrate including a plurality of trace lines comprising integrated bump pads;
a plurality of mask patches formed between the integrated bump pads; and a bump retained between one of the plurality of die bump pads and integrated bump pads by a surface tension.

8. The semiconductor device of claim 7, wherein the plurality of mask patches is isolated and formed interstitially within an array of the plurality of die bump pads or an array of the integrated bump pads.

9. The semiconductor device of claim 7, wherein the surface tension maintains confinement of the bump material around the die bump pads and integrated bump pads.

10. The semiconductor device of claim 7, wherein the plurality of mask patches includes non-wettable material.

11. The semiconductor device of claim 7, wherein the bump includes a non-fusible base and fusible cap.

12. The semiconductor device of claim 7, wherein an escape pitch of the plurality of trace lines is given by (1.1D+W)/2, wherein D is a diameter of the bump and W is a width of the plurality of trace lines.

13. The semiconductor device of claim 7, wherein the plurality of mask patches confines the bump around the one of the integrated bump pads.

14. A semiconductor device, comprising:
a substrate including a plurality of trace lines comprising integrated bump pads;
a plurality of isolated mask patches formed between the integrated bump pads; and
an interconnect structure disposed over one of the integrated bump pads.

15. The semiconductor device of claim 14, further including a semiconductor die comprising a die interconnect pad connected to the interconnect structure.

16. The semiconductor device of claim 14, wherein the plurality of isolated mask patches is formed interstitially within an array of the integrated bump pads.

17. The semiconductor device of claim 14, wherein the interconnect structure includes a non-fusible base and fusible cap.

18. The semiconductor device of claim 14, wherein:
the integrated bump pads are co-linear with the plurality of trace lines; and
the plurality of isolated mask patches is formed between the integrated bump pads.

19. The semiconductor device of claim 14, wherein the plurality of isolated mask patches confines the interconnect structure around the integrated bump pads.

20. A semiconductor device, comprising:
a substrate including a plurality of trace lines;
a mask patch formed between the plurality of trace lines; and
an interconnect structure disposed over one of the trace lines.

21. The semiconductor device of claim 20, wherein:
the plurality of trace lines includes integrated bump pads that are co-linear with the plurality of trace lines; and
the mask patch is formed between the integrated bump pads.

22. The semiconductor device of claim 20, further including a semiconductor die comprising a die interconnect pad connected to the interconnect structure.

23. The semiconductor device of claim 20, wherein the mask patch is isolated and formed interstitially within an array of integrated bump pads on the plurality of trace lines.

24. The semiconductor device of claim 20, wherein the interconnect structure includes a non-fusible base and fusible cap.

25. The semiconductor device of claim 20, wherein the mask patch confines the interconnect structure on the one of the trace lines.

* * * * *